(12) United States Patent
Matteson et al.

(10) Patent No.: US 8,140,195 B2
(45) Date of Patent: Mar. 20, 2012

(54) REDUCING MAXIMUM POWER CONSUMPTION USING ENVIRONMENTAL CONTROL SETTINGS

(75) Inventors: Jason Aaron Matteson, Raleigh, NC (US); William Joseph Piazza, Holly Springs, NC (US)

(73) Assignee: International Business Machines Corporation, Armonk, NY (US)

( * ) Notice: Subject to any disclaimer, the term of this patent is extended or adjusted under 35 U.S.C. 154(b) by 263 days.

(21) Appl. No.: 12/130,443

(22) Filed: May 30, 2008

(65) Prior Publication Data

US 2009/0296342 A1    Dec. 3, 2009

(51) Int. Cl.
G05D 23/00 (2006.01)
G06F 1/20 (2006.01)
H05K 7/20 (2006.01)
H02B 1/01 (2006.01)
H02B 1/00 (2006.01)

(52) U.S. Cl. .......... 700/299; 700/300; 361/679.46; 361/688; 361/679.47; 361/676; 361/831

(58) Field of Classification Search ........ 700/299, 700/300; 361/679.46, 688, 679.47, 831, 361/676
See application file for complete search history.

(56) References Cited

U.S. PATENT DOCUMENTS

| | | | |
|---|---|---|---|
| 5,543,667 A * | 8/1996 | Shavit et al. | 307/39 |
| 5,687,079 A * | 11/1997 | Bauer et al. | 700/70 |
| 5,953,237 A * | 9/1999 | Indermaur et al. | 700/295 |
| 6,249,885 B1 | 6/2001 | Johnson et al. | |
| 6,396,675 B1 | 5/2002 | Su | |
| 6,598,173 B1 | 7/2003 | Sheikh et al. | |
| 6,697,963 B1 | 2/2004 | Nouri et al. | |
| 6,922,787 B2 * | 7/2005 | Karpel et al. | 713/320 |
| 6,935,130 B2 * | 8/2005 | Cheng et al. | 62/259.2 |
| 7,210,048 B2 * | 4/2007 | Bodas | 713/320 |
| 7,216,021 B2 * | 5/2007 | Matsubara et al. | 700/295 |
| 2002/0059533 A1 * | 5/2002 | Kaminski et al. | 713/300 |
| 2003/0023885 A1 * | 1/2003 | Potter et al. | 713/300 |
| 2004/0163001 A1 * | 8/2004 | Bodas | 713/300 |
| 2004/0254652 A1 * | 12/2004 | Ota et al. | 700/12 |
| 2005/0030171 A1 * | 2/2005 | Liu et al. | 340/500 |
| 2005/0049729 A1 * | 3/2005 | Culbert et al. | 700/50 |
| 2005/0246558 A1 * | 11/2005 | Ku | 713/300 |

(Continued)

OTHER PUBLICATIONS

Shimodax, "Thinkpad Fan Noise Problem: Light at the End of the Tunnel", Nov. 2005, thinkpads.com Support Community, pp. 1-21.*

(Continued)

*Primary Examiner* — Albert Decady
*Assistant Examiner* — Jason Lin
(74) *Attorney, Agent, or Firm* — Cynthia G. Seal; Jeffrey L. Streets

(57) ABSTRACT

A fan controller causes a fan assembly to flow air through a computer system at a variable airflow rate to cool the computer system. The ambient air temperature to the computer system is detected, and the controller varies the airflow rate as a function of the ambient temperature within an ambient temperature range having an upper limit. The upper limit on the defined ambient temperature range that is used by a fan speed control algorithm may be selectively reduced from a default value in response to electronic input, such from a user or a software object. Correspondingly, the controller limits the air flow rate to a reduced value corresponding to the reduced upper limit. The reduction in stranded power that results from reducing the upper limit on the ambient temperature may be re-allocated, such as to other racks in the data center.

17 Claims, 4 Drawing Sheets

U.S. PATENT DOCUMENTS

| | | | |
|---|---|---|---|
| 2005/0278069 A1* | 12/2005 | Bash et al. | 700/276 |
| 2006/0168975 A1* | 8/2006 | Malone et al. | 62/180 |
| 2007/0032908 A1 | 2/2007 | Hyland et al. | |
| 2007/0047199 A1* | 3/2007 | Tsutsui | 361/687 |
| 2007/0118774 A1* | 5/2007 | Thomas et al. | 713/300 |
| 2007/0153478 A1 | 7/2007 | Lu | |
| 2008/0065912 A1* | 3/2008 | Bodner et al. | 713/300 |
| 2008/0178615 A1* | 7/2008 | Yoon et al. | 62/79 |
| 2008/0294920 A1* | 11/2008 | Hatasaki et al. | 713/323 |
| 2009/0019202 A1* | 1/2009 | Shetty et al. | 710/116 |
| 2009/0234511 A1* | 9/2009 | Ouchi et al. | 700/291 |

OTHER PUBLICATIONS

Shimodax, "Thinkpad Fan Noise Problem: Light at the End of the Tunnel", Nov. 2005, thinkpads.com Support Community, pp. 1-25.*

* cited by examiner

REDUCING MAXIMUM POWER CONSUMPTION USING ENVIRONMENTAL CONTROL SETTINGS

BACKGROUND OF THE INVENTION

1. Field of the Invention

The present invention relates to power management and cooling in a computer system, such as in a rack-mounted computer chassis.

2. Description of the Related Art

The cost to both power and cool a computer system are important considerations in the design, development, and operation of computer systems. Computer systems generate heat as a result of consuming electrical power, and typically require a cooling system to maintain acceptable internal operating temperatures. For example, in a rack-mountable computer system, fans are typically included, either in the rack-mounted components to be cooled or as part of a rack-mounted fan assembly, for generating airflow through the computer system. The airflow rate may be dynamically varied according to the cooling needs, which vary over time. The cooling needs may vary, for example, according to the load placed on electronic components and the corresponding power consumed by the electronic components. Cooling fans consume power in addition to the power consumed by the components that are cooled by the cooling fans. Thus, the power consumption of cooling fans must be factored into the total amount of power available to the computer system.

The power consumed by fans may dramatically increase as a function of fan speed. For example, the power consumption of a fan may be a cubic function of fan speed, such that doubling the speed of a fan can lead to an eight-fold increase in the power consumption of the fan. Additionally, due to various regulations promulgated by industry standards-setting organizations, computer systems are designed for continuous operation under the maximum load that the computer systems are capable of handling in service. Thus, for example, a computer system may be configured to operate the fans at maximum speeds under extreme ambient temperature conditions, in which case the fans may consume a large amount of power. Other equipment such as power supplies and power cables may also be specified according to worst-case conditions, which increases the cost of the computer system.

BRIEF SUMMARY OF THE INVENTION

One embodiment is a method wherein air is flowed through a computer system at a variable airflow rate to cool the computer system. The temperature of ambient air to the computer system is detected. The airflow rate is varied as a function of the ambient air temperature within an ambient air temperature range having an upper limit. The upper limit on the defined ambient temperature range is reduced from a default value in response to electronic input. The airflow rate is limited to a reduced value corresponding to the reduced upper limit of the defined ambient temperature range. Another embodiment provides a computer program product including computer usable program code embodied on a computer usable medium for managing an air-cooled computer system according to the method.

Another embodiment provides a computer system that includes a chassis housing one or more heat-generating components. One or more fans inside the chassis are configured for moving air through the chassis. An ambient temperature detector is configured to detect the ambient temperature of the air to the computer system and generate a signal representative of the detected ambient temperature. A controller in communication with the ambient temperature detector is configured to vary the airflow rate in relation to the ambient temperature, and to selectively reduce power to one or more heat-generating components when the temperature of the one or more heat-generating components exceeds a setpoint value. A user interface in electronic communication with the controller is configured for receiving electronic input and reducing the ambient temperature limit in response.

Other details and embodiments of the invention will be apparent from the following description and the appended claims.

DETAILED DESCRIPTION OF THE INVENTION

The present invention includes one embodiment wherein default environmental parameters provided with a computer system may be changed by a user, and another embodiment wherein default environmental parameters may be changed at the factory. In either embodiment, the computer system may include a cooling system having a variable airflow rate and a management system for varying the airflow rate according to a defined relationship between the airflow rate and the ambient temperature. The defined relationship may be, for example, a table or equation referenced by the management system for selecting and enforcing an airflow rate at any given ambient temperature within a selected ambient temperature range. The ambient temperature range may be provided by default, such as by a system designer, to account for the wide ranging conditions the computer system is likely to encounter during operation. The upper limit of the ambient temperature range may then be reduced, to reduce the corresponding maximum sustained power consumption corresponding to the reduced ambient temperature limit.

For example, a data center with excess cooling capacity may be capable of maintaining ambient air temperature at substantially less than the maximum ambient temperature at which a particular computer system was originally configured to operate. The upper limit on the ambient temperature range may be reduced to a temperature value that the data center is capable of maintaining, thereby reducing the ambient temperature limit and correspondingly reducing the maximum amount of power consumed by the cooling system. A graphical user interface (GUI) may be included for allowing the user to change the environmental parameters. For example, the user could expressly input a reduced ambient temperature limit to the GUI, in which case the GUI may output a predicted reduction in power consumption that would result from the management system enforcing the reduced ambient temperature limit. Alternatively, the user could expressly input a desired power limit to the GUI, and the GUI may output the reduced ambient temperature limit necessary to achieve the desired power limit. The power that is no longer stranded, as a result of reducing the ambient temperature limit on the computer system, may then be re-allocated within the data center, such as by adding another rack of computer equipment and allocating the power to the added rack. Optionally reducing the ambient temperature limit at the factory may also allow the computer system to be built with more economical components having reduced power specifications, but that are still compliant with applicable regulations and sufficient for the electrical requirements of the computer system when operated at the reduced ambient temperature range.

Figure 1:
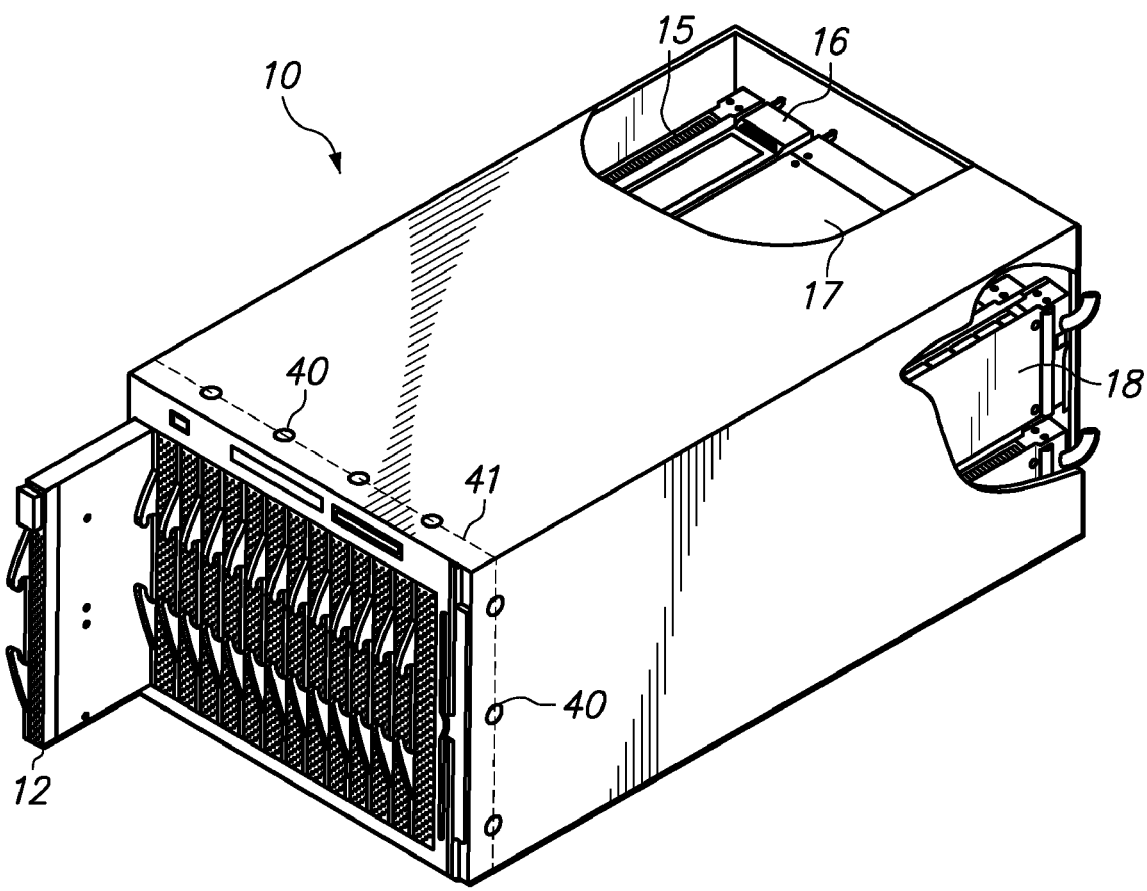
FIG. 1 is a perspective view of an exemplary computer system having a rack-mountable, multi-blade server chassis that may be managed according to an embodiment of the invention.

FIG. 1 is a perspective view of an example of a computer system, in the form of a rack-mountable multi-blade server chassis 10, which may be managed according to an embodiment of the invention. The computer chassis 10 has, by way of example, fourteen server bays for receiving fourteen servers 12. The servers 12 are blade-type servers, which share system resources such as power, cooling, and network connectivity provided by various support modules in the chassis. The support modules include at least one each of a chassis management module 15, a power supply module 16, a fan assembly 17, and a switch module 18. The management module 15 manages the chassis 10, servers 12, and the other modules within the chassis. The power module 16 provides electrical power to all of the servers 12. The fan assembly 17 generates airflow through the chassis 10 to remove the heat generated by the servers 12 and support modules. The switch module 18 provides network connectivity between the blade server I/O and the network. The servers 12 and support modules 15-18 are interconnected within the chassis 10 to provide power and data signal communication. The servers 12 and support modules may interconnect, for example, at an internal chassis interface known as the midplane having rigid connectors with which the servers and support modules blind dock. Cable connections may also be made within the chassis 10, although the midplane may reduce or eliminate cabling requirements.

One or more ambient temperature sensors 40 are provided for sensing the temperature of air entering the chassis 10. A reference plane 41 is show to visualize exemplary locations for the ambient temperature sensors 40. The ambient temperature sensors 40 are typically located near the front of the servers 12, as shown, to detect the temperature of the air before it is has been heated by any internal components. The ambient temperature sensors 40 may be distributed throughout the reference plane 41, and not just at the boundaries of the chassis 10 where the ambient temperature sensors 40 are visible in FIG. 1.

Figure 2:
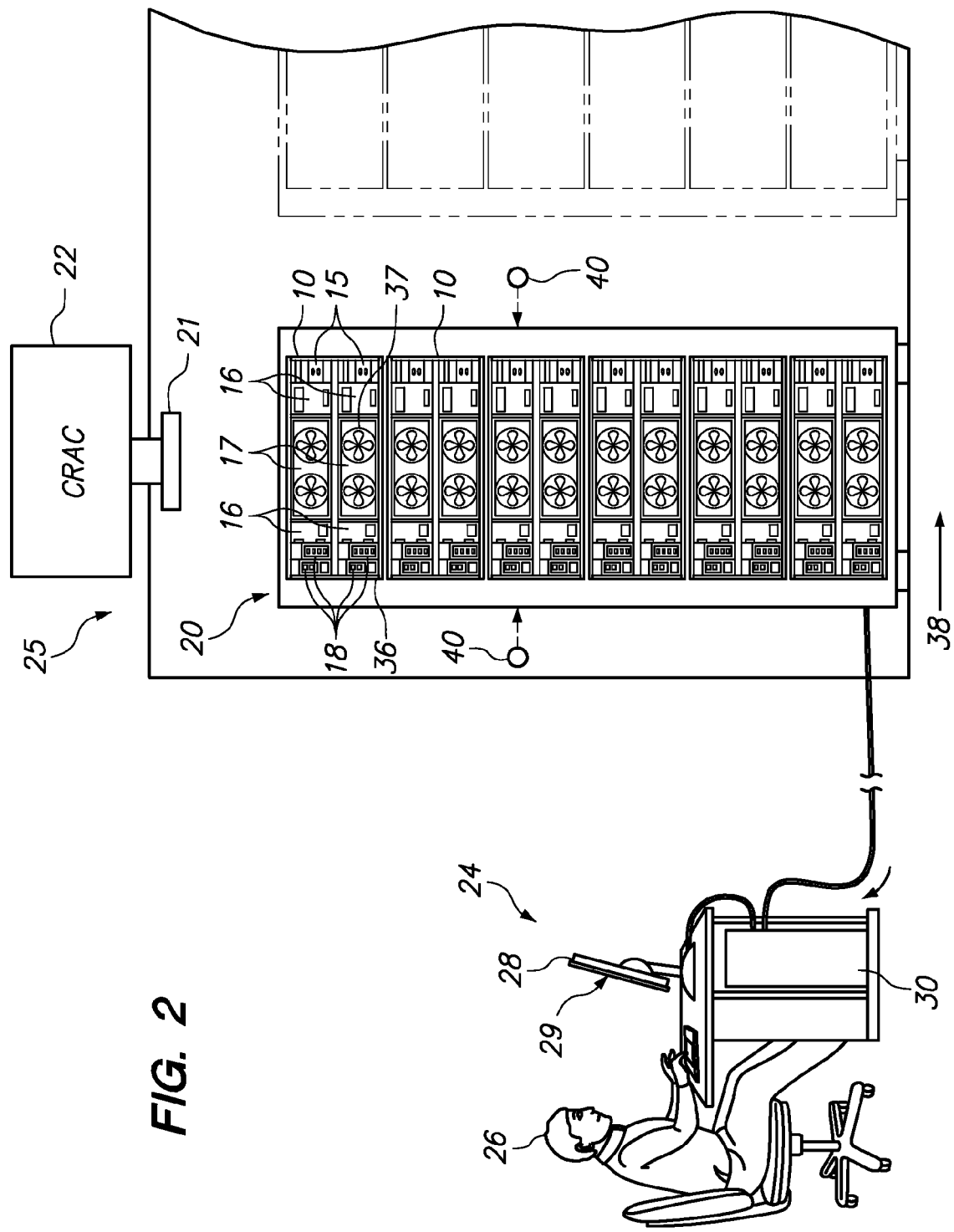
FIG. 2 is a rear elevation view of an exemplary computer equipment rack in a data center being managed by an administrator at a workstation.

FIG. 2 is a rear elevation view of an exemplary computer equipment rack 20 in a data center 25 being managed by a user, who in this case is an administrator 26 at a workstation 24. Six units of the computer chassis 10 of FIG. 1 are mounted in chassis bays provided on the rack 20. The data center 25 has one or more air-conditioning units (CRACs) 22 for controlling environmental parameters such as the temperature and humidity of air in the data center 25. Multiple racks 20 may be arranged in parallel rows according to a hot-aisle/cold-aisle layout. The rear of each chassis 10 in the rack 20 faces a hot aisle 38. The fan assemblies 17 force ambient air to flow through each chassis 10 in order to remove heat generated by the rack-mounted computer equipment such as the servers and support modules. Heated air is exhausted from the rear of each chassis 10 to the hot aisle 38. The heated air is taken up by an air intake 21, circulated through the CRAC 22 to chill the air, and returned to one or more cold aisles in the data center 25, typically through the floor.

Visible from the rear of each chassis 10 are four of the switch modules 18, two of the management modules 15, four of the power modules 16, and two of the fan assemblies 17. Some of the modules in each chassis 10 may be redundant. For example, one of the management modules 15 and two of the switch modules 18 may be provided as backup modules to be operated if the others are taken offline. Each fan assembly 17 is schematically shown as having two visible fans 37, though any number of one or more fans may be included with a fan assembly, and the fans may not be visible without removing a panel. The fan assembly 37 may be any of a variety of types known in the art, including axial or radial fans. The speed of the fans 37 may be individually controlled or controlled as a group to control airflow rate through each chassis 10. The fan assemblies 17 in this embodiment are intended to provide all of the airflow needed to cool all of the servers 12 in the chassis 10. It should be recognized that the fan assemblies 17 within the chassis 10 may be integrated into a single fan assembly.

The workstation 24 is networked with the servers 12 (See FIG. 1), allowing a system administrator 26 to interface with the computer chassis 10. The workstation 24 may be remotely located, possibly outside the data center 25, for the convenience and safety of the administrator 26. The workstation 24 includes a management console 28, which has a customizable graphical user interface 29, and a management server 30, which can remotely support potentially thousands of servers 12 in the data center 25. Local software may be installed on each server 12, allowing the management server 30 to interface with the servers 12 to monitor and control the servers 12. For example, the local software on each server may send alert signals to the management server 30 to warn the system administrator 26 if and when intervention is required for a particular server. The workstation 24 may also allow the system administrator 26 to monitor and control aspects of internal system parameters, such as power consumption of each chassis 10, internal temperatures such as processor temperatures, and airflow through each chassis 10. The workstation 24 may further allow the system administrator 26 to monitor environmental parameters (external to the various chassis 10) such as ambient temperatures sensed by one or more ambient temperature sensors 40 (see FIG. 1).

The servers and other computer equipment in the rack 20 may be managed according to a management system that may be described in terms of a multi-tiered management hierarchy. A first tier of the management system may include the workstation 24 from which operational settings may be established and monitored by the administrator 26. A second tier may include the chassis-level management modules 15 that provide comprehensive support for all chassis components and enforce some of the operational settings established from the workstation 24. A third tier may include a server-level baseboard management controller (BMC) located on each server 12 (FIG. 1). Management functions provided by the management modules 15 include chassis configuration, chassis cooling (e.g. fan control and temperature sensing), power module control, blade initialization, switch module initialization, media selection and control (e.g. CD-ROM or floppy disk drive), remote and local console control, customer interface panel, chassis-level power management, power on/off control, chassis thermal sensing (e.g. monitoring thermal status and post alerts), serial-over-LAN (SOL) session control and terminal server. Management functions provided by the server blade BMC may include power on/off control, media control, keyboard and mouse control, video control, thermal sensing, communication with management module, blade power management, and SOL session control. In addition to supporting normal processor management function, the BMC on each blade provides control and status information by communicating with the management module(s) 15 over, for example, an RS-485 bus using an intelligent platform management interface (IPMI) protocol. An external Ethernet link on the management modules 15 provides connectivity for remote management by the workstation 24, including full console capability (KVM) with keystroke selection of the target processor blade. PS/2 and video ports on the management module enable local console (KVM) access to individual servers 12 with keystroke selection.

The management system may be used to manage the operation of the computer equipment in the data center 25, including power and cooling of one or more target computer systems in the data center 25. For example, each chassis 10 may be identified as a target computer system to be managed. The entire rack 20 may alternatively be selected as the target computer system. A finite amount of power is typically allocated to the data center 25. The power allocated to the data center 25 may be apportioned among the racks 20. The power apportioned to each rack 20 may be further apportioned among the chassis 10 in the rack 20. The power apportioned to each chassis 10 may be further apportioned among the servers and support modules. Power to the servers, support modules, chassis 10, and racks 20 may then be managed within their respective apportioned power limits. The servers, support modules, and other rack-mounted computer equipment consume power and generate heat in relation to the power consumed. The fan assemblies 17 generate airflow to remove the generated heated, and consume power in relation the rate of the generated airflow. Therefore, power and cooling are interrelated, in that the power required to operate the fans must be accounted for when operating the chassis 10 within its apportioned amount of power.

The heat produced by each server 12 is generated primarily by the microprocessors ("processors"). Each server includes one or more processors that generate heat in relation to their power consumption, and consume power in relation to the amount of load placed on the processors (referred to here as the "processor load"). Processor load generally relates to the intensity of processing performed by the processors, and is typically tied to numerous factors such as processor speed, clock speed, bus speed, the number of individual processors recruited for performing a task, and so forth. Processor performance metrics such as MIPS ("million instructions per second") or teraflops may be used to describe processor load. The amount of processor load may also be characterized in terms of a processor's maximum processing capacity, such as a percentage of the processor's maximum utilization (i.e. "percent utilization"). The percent utilization of a group of processors may be expressed in terms of the combined processing capacity of the multiple processors. For example, the percent utilization of a group of processors may be expressed as an average of the utilization of the individual processors in the group. The load on processors is typically dynamic, so the percent utilization, itself, may be expressed instantaneously or as an average utilization over time.

Various techniques may be used for controlling power consumed by the processors and the corresponding amount of heat generated by the processors. These techniques include reducing power consumption by selectively "throttling" the processor(s), placing subsystems into power-saving modes of operation, or powering off unused circuitry. Other examples of reducing processor load and power consumption include reducing a clock frequency or operating voltage of one or more of the CPUs, or introducing wait or hold states into the activity of the CPUs. Power consumption of the processors is not necessarily a well-defined or predictable function of processor load. There are many cases, for example, where power consumption may be completely different when processor load appears to be 100%, due to the behaviors of the underlying microarchitectures, transistor variability on a per-chip basis, and many other complex factors that affect power consumption. Nevertheless, techniques such as throttling may be used in combination with control loops associated with the BMC to monitor the instantaneous power consumption and continuously adjust the processor load to achieve a desired level of power consumption.

Airflow rate is required to increase (e.g. by increasing fan speed or increasing the number of fans recruited) as ambient temperatures increase. The reason for increasing airflow rate as a function of ambient temperature is that there is a maximum junction temperature for the silicon circuitry. Given a constant airflow rate (and, therefore, a constant cooling rate), as ambient temperature increases the junction temperature will also increase. The airflow rate must increase, such as by increasing fan speed, to prevent the junction temperatures specifications from being violated. When fan speeds ramp up the cooling rate increases, such that the downstream air temperature at a specific location (the ambient temperature plus the temperature increase caused by heating the air) is less than the downstream air temperature would have been at the same location if the fan speed had not been increased. As an example, assume that a 100 Watt processor with 8.8 cubic feet-per-minute (CFM) of airflow rate will increase the temperature of the air passing over it by about 20 C. at sea level. If ambient temperature is 20 C. then the downstream air temp will be 40 C., and the junction temp of the processor will be higher than 40 C. However if the ambient temperature is 30 C. then the downstream air temperature is about 50 C. and the junction temperature is higher than 50 C., which might exceed the specified junction temperature. So, by increasing the airflow rate, such as by increasing the fan speed to generate 15 CFM of airflow, the downstream air temperature assuming 30 C. ambient temperature may be reduced to about 42 C., which may be less than the maximum specified junction temperature.

Thus, the management system is configured to control the airflow rate in defined relation to the ambient air temperatures sensed by the ambient air temperature sensors. For example, the management system may control the airflow rate according to a fan control algorithm for selecting the airflow rate as a function of the sensed ambient air temperature. At some maximum ambient air temperature value, the fan assemblies 17 will be incapable of adequately cooling the computer equipment even when the fan assemblies 17 are operating at full capacity. Thus, a maximum allowable ambient air temperature may be specified as a setpoint into the fan control algorithm. The default setpoint value for the maximum allowable ambient air temperature may be denoted as $T_{amb-max}$. Regulations may require that the computer equipment specifications, such as power supply ratings and cabling requirements, be selected according to a worst-case scenario of operating the computer equipment at $T_{amb-max}$ for a sustained time period.

Figure 3:
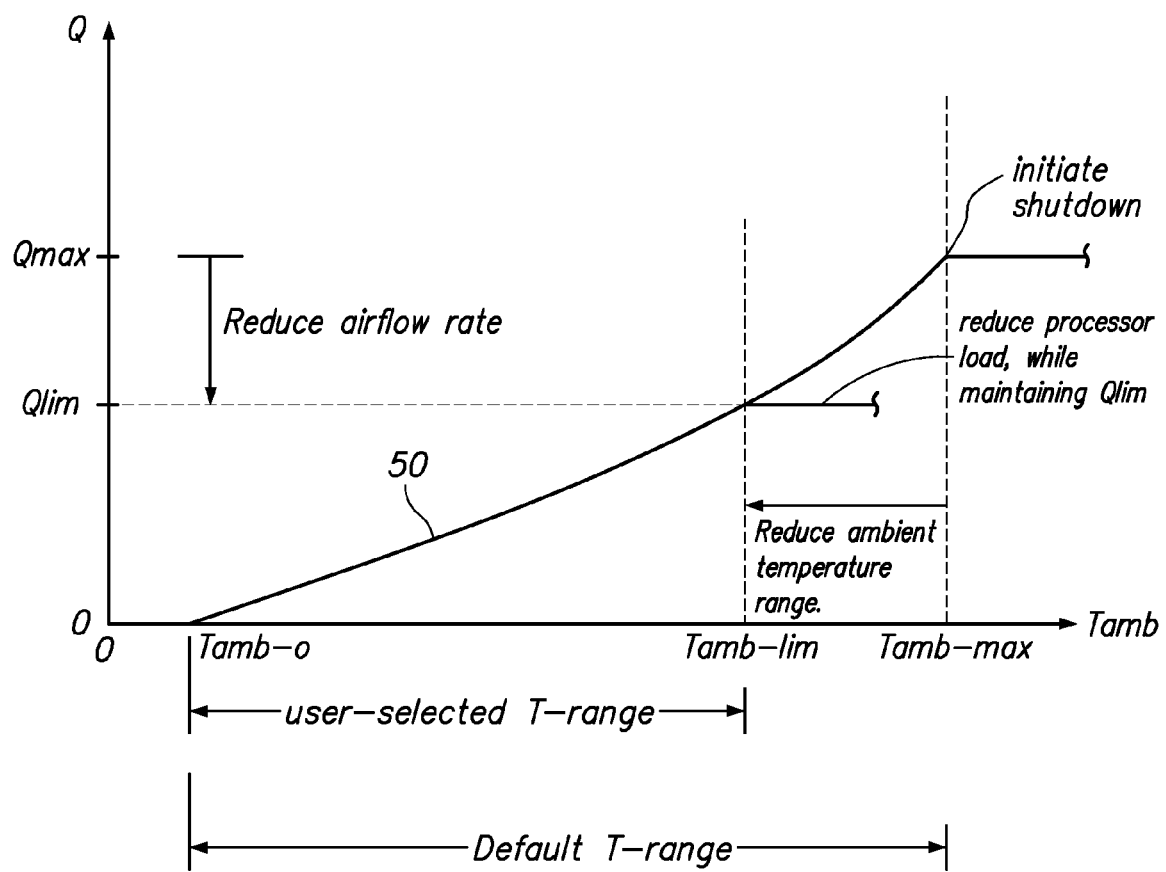
FIG. 3 is a graph plotting an exemplary fan performance curve defining the relationship between the detected ambient air temperature and the airflow rate to be enforced by the management system.

FIG. 3 is a graph plotting an exemplary "fan performance curve" 50 representing the relationship between the detected ambient air temperature and the airflow rate to be enforced by the management system. The fan performance curve 50 spans a default temperature range between a minimum ambient temperature $T_{amb-0}$ and the maximum ambient temperature $T_{amb-max}$. The fan performance curve 50 specifies an airflow rate to be enforced for any value of ambient air temperature $T_{amb}$ between $T_{amb-0}$ and $T_{amb-max}$. The fan performance curve may be embodied, for example, in the form of a table or equation referenced by the management system. The airflow rate may depend on one or more other variable, in addition to ambient temperature, in which case the exemplary fan performance curve 50 may represent the relationship between the air flow rate (Q) and $T_{amb}$ with the other variables held constant. One endpoint of the fan performance curve sets the minimum airflow rate to be enforced at $T_{amb-0}$. The default value of $T_{amb-0}$ may be selected as the coolest ambient air temperature that the system is expected to experience. The other endpoint of the fan performance curve describes the maximum airflow rate $Q_{max}$ to be enforced at the maximum ambient air temperature $T_{amb-max}$. The default value of $T_{amb-max}$ may be the highest sustained ambient air temperature at which the system may be safely operated while still maintaining safe internal temperatures. At ambient air temperature of greater than $T_{amb-max}$, power to the system may be shut down to prevent the possibility of overheating internal components. A safety factor may be included in the selection of the default temperature range.

The management system may control the airflow rate according to the performance curve of FIG. 3 using any combination of controlling the speed of the fans 37 and/or the number of fans 37 recruited at a given moment. The relationship between the number of fans recruited and the power consumption of the fans is typically linear. For example, the power consumption of two substantially identical fans at a given fan speed may produce about twice the airflow with about twice the power consumption of just one of the fans at that same fan speed. The relationship between fan speed and power consumption is typically exponential. For example, the power consumption of the fans may be a cubic function of fan speed, such that a 50% reduction in fan speed results in approximately an eight-fold reduction in power consumption of the fans. A first exemplary approach to controlling airflow rate is to operate all of the fans 37 in a particular blower module simultaneously and at substantially equal fan speeds, so that the fan speed of the fans 37 is the only variable governing the airflow rate Q. According to that first approach, increasing airflow would entail increasing fan speed, with potentially exponential increases in fan power consumption. However, by operating all of the fans simultaneously, the fan speed of each fan 37 would be minimized, as compared with operating fewer than all of the fans 37 in a blower module at higher fan speeds to produce an equivalent airflow rate. A second exemplary approach to controlling fan speed is to operate fewer than all of the fans in a particular target computer system, and to selectively recruit additional fans, as needed, to increase the airflow rate. The second exemplary approach may be implemented, for example, in a system wherein multiple fans are included at different locations in a computer chassis. Adjusting the airflow rate by changing the number of recruited fans while maintaining a constant fan speed would result in a fan power consumption in proportion to the number of fans recruited. In a third exemplary approach, a fan control algorithm may be included to vary both the number of fans operated and the speed of the fans being operated in relation to the ambient air temperature.

The default ambient air temperature range may be conservatively selected by the system designer to account for the wide range of different data center environments where the computer equipment may be installed. Thus, the default temperature range may be wider than necessary for many applications, and in particular, the maximum ambient air temperature recognized by the fan controller, $T_{amb-max}$, may be higher than the computer system will experience under most operating conditions and in most data center environments. Industry regulations typically provide additional system specifications to ensure that computer equipment is capable of safely sustaining the maximum possible power consumption. For example, industry regulations mandate certain power supply and wiring specifications according to the maximum operating capacity of the target computer system. Moreover, sufficient power must be allocated to the target computer system according to the maximum capacity. However, most computer systems will rarely operate at maximum capacity for any significant length of time and, therefore, the operating conditions will rarely necessitate operating the fans at their maximum speed for a sustained period of time. As a result, the amount of power actually used by the fans in the target computer system may be significantly less than the amount of power allocated to the fans. The difference between the allocated power and the actual power may be referred to as stranded power, which means there is an unproductive allocation of power. Additionally, equipment such as power-supplies and power cables may be larger and more costly than necessary under most ordinary operating conditions.

One embodiment of the invention provides a fan controller that adjusts fan speed over an ambient air temperature range that may be user-modified in order to reduce the power requirements and associated expenses of operating the target computer system. In the exemplary embodiment of FIG. 2, for example, the administrator 26 may use the GUI 29 on the management console 28 to expressly input a reduced upper limit on the ambient air temperature range $T_{amb-lim}$ to be imposed by the management system, where $T_{amb-lim}$ is less than $T_{amb-max}$ in FIG. 3. Alternatively, the administrator 26 may use the GUI 29 to input a power target, such as in the form of a desired reduction in the maximum sustained power consumption, and the reduced ambient temperature limit $T_{amb-lim}$ necessary for achieving the power target may be computed and enforced by the management system and optionally displayed by the GUI 29.

Even with the reduced ambient temperature limit $T_{amb-lim}$ being imposed, the fan assemblies 17 will still operate along the portion of the fan performance curve 50 of FIG. 3 for ambient temperatures between $T_{amb-0}$ and $T_{amb-lim}$. However, the airflow rate will not be increased beyond a reduced upper limit $Q_{lim}$ on the airflow rate that occurs at $T_{amb-lim}$. Instead, even for ambient temperatures detected above $T_{amb-lim}$, the airflow rate may be held constant at $Q_{lim}$, and other steps will be taken to avoid exceeding safe internal operating temperatures. For example, power to the processors may be reduced to reduce the corresponding heat generated by the processors. When the airflow rate is already at $Q_{lim}$ and power reduction techniques such as throttling are not sufficient to maintain safe internal processor temperatures, the system may shut down.

Thus, in exchange for the opportunity to reallocate power from the fans to another component in a target computer system or to another computer system within the same data center, the administrator may reduce the upper limit of the ambient air temperature range that the fan controller will recognize knowing that the processors may be throttled or that the servers may begin shutting down at lower temperatures than would occur if the default upper limit was maintained. In many data centers, the compromise may be deemed worthwhile by the administrator because the default ambient air temperature range for the target computer system will typically be greater than what the system will ever actually experience. The administrator may also take measures, according to the particular data center resources, to help maintain the ambient air temperatures in the data center 25 below $T_{amb-lim}$. For example, if the data center has excess cooling capacity in the CRAC units, the administrator may increase the operation of the CRACs to keep the ambient temperatures within the reduced ambient temperature range. As a result of reducing the upper limit of the ambient air temperature recognized by the fan controller, the amount of power allocated to the target computer system may be reduced, such as to a particular rack or chassis, and the "energy savings" may be reallocated to another computer system or subsystem within the data center 25. The power ratings of cabling, power supplies, and other infrastructure to the target computer system may also be reduced while remaining in compliance with applicable regulations since the maximum power consumption of the target computer system has been reduced.

Safeguards are likely to be imposed to avoid indiscriminant reductions in the ambient temperature limit to be imposed on a system, such as by personnel who have not been provided with explicit authorization to do so, so that electrical limitations specified by industry regulations are not inadvertently exceeded. For example, a GUI provided for selecting the ambient temperature limit may be password protected so that only authorized personnel, such as an authorized electrician or technician, can change the ambient temperature limit.

Another safeguard could be to allow the end user to specify a reduced ambient temperature limit when ordering a computer system, such as a server chassis or rack system, but to set the reduced ambient temperature limit at the factory where the computer system is manufactured so that the ambient temperature limit could not later be increased. An end user desiring to limit power consumption for a particular data center might request a reduced maximum power consumption when ordering the computer system to be installed in that data center. For example, a particular model of computer system may be uniquely identified by a "part number," and the end user may specify a custom-selected power setting for the computer system identified by that part number. Alternatively, a set of different part numbers may be used to uniquely identify substantially the same computer system being offered at different power ratings. In response to the purchase order, a reduced ambient temperature limit may be selected at the factory corresponding to the end user's requested maximum power consumption for that equipment. The ordered computer system may then be equipped according to the reduced maximum power consumption associated with the reduced ambient temperature limit. For example, smaller power supplies or smaller gauge wiring may be used to assemble the computer system, but in full compliance with regulations governing power supplies and wiring for that power consumption. Having set the ambient temperature limit at a fixed value at the factory, the ambient temperature limit could not be readily increased later, so that the computer system would continue to operate within the maximum power range it was equipped to handle according to industry regulations.

Figure 4:
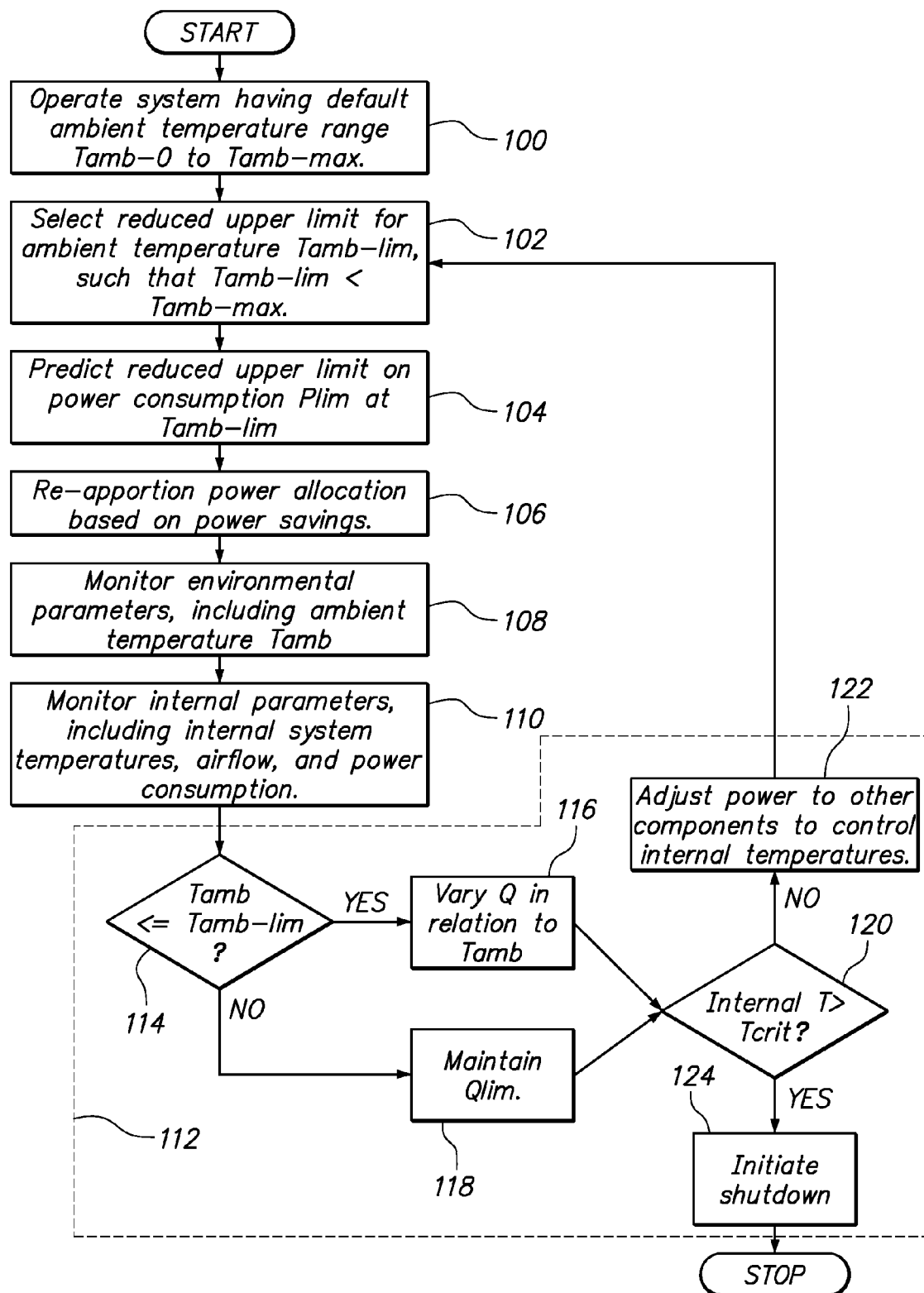
FIG. 4 is a flowchart outlining a method of managing a target computer system according to another embodiment of the invention, wherein the target computer system is generalized to any air-cooled computer system.

FIG. 4 is a flowchart outlining a method of managing a target computer system according to another embodiment of the invention, wherein the target computer system is generalized to any air-cooled computer system. The method may be implemented in the form of a fan speed control algorithm embodied in software executable by a fan speed controller of the target computer system. For example, as the method may be applied to the computer equipment in the data center of FIG. 2, the algorithm may be implemented by software executed on the multi-tiered management system. According to step 100, the target computer system is operated under a default ambient air temperature range. For example, the default ambient air temperature range may be programmed into the system when the system is manufactured. The default ambient air temperature range has an upper value $T_{amb-max}$, at which a maximum airflow rate $Q_{max}$ is to be enforced. The airflow rate may be controllable according to a defined relationship with various parameters or conditions including, but not limited to, the ambient air temperature range. The defined relationship may be programmed into a controller that controls a single fan or a fan assembly (e.g. a blower module) having multiple fans.

According to step 102, a reduced ambient temperature range may be provided to the fan speed control algorithm. For example, if the user determines that the particular data center where the computer system is installed is easily capable of maintaining ambient temperatures less than the default upper limit $T_{amb-max}$, then the user or a software object may select a reduced upper limit $T_{amb-lim}$ for use by the fan speed control algorithm. A reduced upper limit $Q_{lim}$ on the airflow rate corresponds to the reduced upper limit $T_{amb-lim}$ on the ambient temperature, according to the defined relationship between ambient temperature and airflow rate set out in the algorithm. The user may input the reduced upper limit to the ambient air temperature range using an electronic interface, including input/output peripherals such as a display, keyboard, and pointing device at a workstation. Alternatively, the reduced ambient temperature range may be altered by connecting a hardware component such as a jumper, memory module, or smart card into an interface that reads the reduced ambient temperature range recorded on that hardware component. The reduced ambient temperature range might alternatively be established at the time the target computer system is manufactured or assembled. For example, the target computer system may pre-configured with an ambient air temperature range selected considering details about the customer facility at which the target computer system is to be installed.

According to step 104, the system may compute an upper limit on the power consumption $P_{lim}$ that would occur at the reduced upper limit $T_{amb-lim}$ and corresponding reduced upper limit $Q_{lim}$ on the airflow rate. To compute the upper limit on the power consumption, the system may reference a data table, equation, or other correlation between airflow rate Q and ambient temperature $T_{amb}$ for the system to determine the maximum airflow rate to be enforced at $T_{amb-lim}$. The system may then compute the fan speed and/or number of fans that would be required to produce that maximum airflow rate, and predict the power consumption according to the number of fans and the fan speeds. The system may then output an indication of the predicted reduction in power consumption resulting from reducing the upper limit on the defined temperature range. For example, the system may determine and/or display a predicted power consumption of the fans, a predicted power consumption of the computer system including the fans, or a predicted decrease in maximum sustainable power consumption at the reduced ambient temperature limit $T_{amb-lim}$. The system may receive multiple prospective values for $T_{amb-lim}$ from the user and display an indication of the power savings that would result at each of the prospective values of $T_{amb-lim}$. For example, in a data center having a fixed power allocation, an administrator who desires to add another rack of computer equipment to the data center may input the multiple prospective values of $T_{amb-lim}$ in an effort to iteratively determine a reduced ambient air temperature limit that would result in a reallocation of enough power to operate the additional rack. In step 106, this "power savings" may be re-allocated to other systems or subsystems, such as to the additional rack desired to be added. The system continues to be operated according to the defined relationship between Q and $T_{amb}$ over the reduced ambient air temperature range. As the target computer system is operated, environmental parameters such as ambient temperature are monitored according to step 108. Internal parameters such as internal temperature(s) are monitored according to step 110.

The airflow may be adjusted in relation to ambient temperature according to a control loop outlined at 112. According to conditional step 114, if the ambient air temperature is less than or equal to the reduced upper limit of the ambient air temperature, then the airflow rate Q is varied in relation to the ambient temperature according to a defined relationship in step 116. The airflow rate Q may be a function of other variables in addition to ambient temperature. For example, the airflow rate Q to be enforced may be a function of both ambient temperature and internal temperatures, in which case the airflow rate may be increased in response to either increasing internal temperatures or increasing ambient temperatures. If ambient temperatures are instead determined to exceed the reduced upper limit of the ambient temperature in step 114, then the system is not required to be immediately shut down, particularly if the elevated ambient temperature is temporary. Rather, the reduced upper limit $Q_{lim}$ on the airflow rate may be maintained according to step 118, and safe internal temperatures may be maintained by controlling the power consumed by heat generating components, such as by controlling the load on a processor.

Internal temperatures may be continuously monitored regardless of ambient temperature or airflow rate to ensure safe internal operating temperatures. Conditional step 120 determines whether any of the internal temperatures exceed a setpoint value referred to as a critical temperature specified for the target computer system. As long as these internal temperatures do not exceed their critical temperatures, the power to other components may be controlled to control temperatures according to step 122. For example, processor load may be controlled, such as by throttling the processors, to reduce their power consumption and the corresponding generation of heat. If internal temperatures exceed critical temperatures, indicating it is unsafe to continue operating the system at those temperatures, then more drastic reductions in power may be implemented to control temperatures. By way of example, step 124 prescribes shutting down at least part of the target computer system in response to exceeding the critical temperatures as determined in conditional step 120. An example of a scenario wherein critical temperatures may be exceeded is if the CRAC fails and is unable to control ambient temperatures and is unable to control temperatures to within the reduced ambient temperature range. In that scenario, rather than continuing to operate the target computer system for an extended period of time at the elevated ambient temperatures, the target computer system may be shut down as indicated in step 124.

As will be appreciated by one skilled in the art, the present invention may be embodied as a system, method, or computer program product. Accordingly, the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, embodiments of the present invention may take the form of a computer program product embodied in any tangible medium of expression having computer usable program code embodied in the medium.

Any combination of one or more computer usable or computer readable medium(s) may be utilized. The computer-usable or computer-readable medium may be, for example but not limited to, an electronic, magnetic, optical, electromagnetic, infrared, or semiconductor system, apparatus or device. More specific examples (a non-exhaustive list) of the computer-readable medium include any of the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CDROM), an optical storage device, or a magnetic storage device. Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory. In the context of this document, a computer-usable or computer-readable medium may be any medium that can contain, store, communicate, propagate, or transport the program for use by or in connection with the instruction execution system, apparatus, or device. The computer-usable medium may include a propagated data signal with the computer-usable program code embodied therewith, either in baseband or as part of a carrier wave. The computer usable program code may be transmitted using any appropriate medium, including but not limited to wireless, wireline, optical fiber cable, RF, etc.

Computer program code for carrying out operations of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The present invention may be described above with reference to, for example, flowchart illustrations and/or block diagrams of methods, apparatuses (systems), and computer program products according to embodiments of the invention. It will be understood that each block of the flowchart illustrations and/or block diagrams, and combinations of blocks in the flowchart illustrations and/or block diagrams, or functions/acts described with reference to system or apparatus figures, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, implement the functions/acts specified in the flowchart and/or block diagram block or blocks, or functions/acts described with reference to system or apparatus figures.

These computer program instructions may also be stored in a computer-readable medium that can direct a computer or other programmable data processing apparatus to function in a particular manner, such that the instructions stored in the computer-readable medium produce an article of manufacture including instruction means which implement the function/act specified in the flowchart, block diagram blocks, or with respect to the apparatus or systems shown. The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide processes for implementing the functions/acts specified in the flowchart, specified in the block diagram blocks, and/or specified with reference to the system or apparatus shown in the figures.

Any flowchart and block diagrams in the figures may illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, components and/or groups, but do not preclude the presence or addition of one or more other features, integers, steps, operations, elements, components, and/or groups thereof. The terms "preferably," "preferred," "prefer," "optionally," "may," and similar terms are used to indicate that an item, condition or step being referred to is an optional (not required) feature of the invention.

The corresponding structures, materials, acts, and equivalents of all means or steps plus function elements in the claims below are intended to include any structure, material, or act for performing the function in combination with other claimed elements as specifically claimed. The description of the present invention has been presented for purposes of illustration and description, but it not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A method, comprising:
   cooling a computer system by flowing air through a computer system at a variable airflow rate determined by a controller;
   detecting the temperature of ambient air to the computer system and communicating that temperature to the controller;
   the controller varying the airflow rate as a function of the ambient air temperature within an ambient air temperature range having an upper limit;
   electronically inputting a target value for the power consumption of the computer system;
   computing a predicted reduction in the upper limit on the defined temperature range necessary to achieve the inputted target value for the power consumption of the computer system; and
   reducing the upper limit of the ambient temperature range from a default value so that the controller limits the airflow rate to a reduced airflow rate corresponding to the reduced upper limit of the defined ambient temperature range.

2. The method of claim 1, further comprising reducing power to a selected heat-generating component of the computer system in response to the temperature of the selected heat-generating component exceeding a setpoint while continuing to limit the airflow rate to the reduced value corresponding to the reduced upper limit on the defined ambient temperature range.

3. The method of claim 2, wherein the step of reducing power to selected heat-generating components of the computer system includes reducing processor load of the heat-generating components.

4. The method of claim 1, wherein the step of varying the airflow rate in relation to the ambient temperature comprises one or both of varying a fan speed and varying a number of fans being operated.

5. The method of claim 1, further comprising maintaining the reduced upper limit on the airflow rate corresponding to the reduced upper limit on the defined ambient temperature range in response to the ambient temperature exceeding the reduced upper limit on the defined ambient temperature range.

6. The method of claim 1, further comprising selecting the default ambient temperature range provided by a regulatory body.

7. A computer system, comprising:
   a chassis housing one or more heat-generating components;
   one or more fans inside the chassis configured for moving air through the chassis;
   an ambient temperature detector configured to detect the ambient temperature of the air to the computer system and generate a signal representative of the detected ambient temperature;
   a controller in communication with the ambient temperature detector and configured to vary the airflow rate in relation to the ambient temperature, and to selectively reduce power to one or more heat-generating components when the temperature of the one or more heat-generating components exceeds a setpoint value; and
   a user interface in electronic communication with the controller and configured for receiving electronic input including a target power consumption limit of the computer system and reducing the ambient temperature limit to reduce the power consumed by the fans.

8. A computer program product including computer usable program code embodied on a non-transitory computer readable medium for managing an air-cooled computer system, the computer program product including:

computer usable program code for detecting the ambient air temperature about the air-cooled computer system;

computer usable program code for varying an airflow rate through the computer system in defined relation to the ambient temperature within a defined ambient temperature range and limiting the airflow rate to a value corresponding to an upper limit on the defined ambient temperature range;

computer usable program code for reducing the upper limit on the defined ambient temperature range from a default value in response to electronic input and limiting the airflow rate to a reduced value corresponding to the reduced upper limit on the defined ambient temperature range; and computer usable program code for computing and outputting an indication of one or both of a predicted reduction in power consumption due to the reduced airflow rate corresponding to the reduced upper limit on the defined temperature range and a predicted reduction in the upper limit on the defined ambient temperature range required to achieve a target reduction in maximum sustained power consumption.

9. The computer program product of claim 8, further comprising:

computer usable program code for reducing power to selected heat-generating components of the computer system in response to the ambient temperature exceeding the reduced upper limit on the defined ambient temperature range while continuing to limit the airflow rate to the reduced value corresponding to the reduced upper limit on the defined ambient temperature range.

10. The computer program product of claim 9, wherein the computer usable program code for reducing power to selected heat-generating components of the computer system includes computer usable program code for reducing processor load of the heat-generating components.

11. The computer program product of claim 9, wherein the computer usable program code for reducing processor load comprises computer usable program code for selectively throttling the processors or placing subsystems that use the processors into power-saving modes of operation.

12. The computer program product of claim 9, wherein the computer usable program code for reducing processor load comprises computer usable program code for powering off one or more components in response to exceeding a critical internal temperature.

13. The computer program product of claim 8, wherein the computer usable program code for varying the airflow rate in relation to the ambient temperature comprises computer usable program code for one or both of varying a fan speed and varying a number of fans being operated.

14. A method, comprising:

cooling a computer system by flowing air through a computer system at a variable airflow rate determined by a controller;

detecting the temperature of ambient air to the computer system and communicating that temperature to the controller;

the controller varying the airflow rate as a function of the ambient air temperature within an ambient air temperature range having an upper limit;

electronically inputting a target value for a reduced upper limit on the defined ambient temperature range;

computing a predicted reduction in power consumption associated with the reduced airflow rate corresponding to the reduced upper limit on the defined temperature range; and reducing the upper limit of the ambient temperature range from a default value so that the controller limits the airflow rate to a reduced airflow rate corresponding to the reduced upper limit of the defined ambient temperature range.

15. A method, comprising:

cooling a computer system by flowing air through a computer system at a variable airflow rate determined by a controller;

detecting the temperature of ambient air to the computer system and communicating that temperature to the controller;

the controller varying the airflow rate as a function of the ambient air temperature within an ambient air temperature range having an upper limit;

imposing a net power limit on a data center housing the computer system and allocating a portion of the net power limit to the computer system;

computing a predicted reduction in power consumption resulting from reducing the upper limit on the defined temperature range;

reducing the upper limit of the ambient temperature range from a default value so that the controller limits the airflow rate to a reduced airflow rate corresponding to the reduced upper limit of the defined ambient temperature range; and re-allocating an amount of power equal to at least a portion of the reduction in power consumption from the computer system to another computer system in the data center.

16. A computer system, comprising:

a chassis housing one or more heat-generating components;

one or more fans inside the chassis configured for moving air through the chassis;

an ambient temperature detector configured to detect the ambient temperature of the air to the computer system and generate a signal representative of the detected ambient temperature;

a controller in communication with the ambient temperature detector and configured to vary the airflow rate in relation to the ambient temperature, and to selectively reduce power to one or more heat-generating components when the temperature of the one or more heat-generating components exceeds a setpoint value; and a user interface in electronic communication with the controller and configured for receiving electronic input including a target value for the reduced ambient temperature limit, and reducing the ambient temperature limit to reduce the power consumed by the fans.

17. A computer program product including computer usable program code embodied on a non-transitory computer readable medium for managing an air-cooled computer system, the computer program product including:

computer usable program code for detecting the ambient air temperature about the air-cooled computer system;

computer usable program code for varying an airflow rate through the computer system in defined relation to the ambient temperature within a defined ambient temperature range and limiting the airflow rate to a value corresponding to an upper limit on the defined ambient temperature range;

computer usable program code for enforcing a net power limit on a data center housing the computer system and allocating a portion of the net power limit to the computer system;

computer usable program code for computing a predicted reduction in power consumption due to the reduced airflow rate corresponding to the reduced upper limit on the defined temperature range;

computer usable program code for reducing the upper limit on the defined ambient temperature range from a default value in response to electronic input and limiting the airflow rate to a reduced value corresponding to the reduced upper limit on the defined ambient temperature range; and computer usable program code for re-allocating an amount of power equal to at least a portion of the reduction in power consumption from the computer system to another computer system in the data center.

* * * * *